United States Patent
Gappisch et al.

(10) Patent No.: US 6,876,591 B2
(45) Date of Patent: Apr. 5, 2005

(54) INTEGRATED CIRCUIT WITH SELF-TEST DEVICE FOR AN EMBEDDED NON-VOLATILE MEMORY AND RELATED TEST METHOD

(75) Inventors: Steffen Gappisch, Zürich (CH); Georg Farkas, Binz (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/475,371

(22) PCT Filed: Apr. 22, 2002

(86) PCT No.: PCT/IB02/01515
§ 371 (c)(1),
(2), (4) Date: Oct. 21, 2003

(87) PCT Pub. No.: WO02/086907
PCT Pub. Date: Oct. 31, 2002

(65) Prior Publication Data
US 2004/0109370 A1 Jun. 10, 2004

(30) Foreign Application Priority Data
Apr. 25, 2001 (EP) .............................. 01110213

(51) Int. Cl.⁷ .............................. G11C 29/00
(52) U.S. Cl. ............. 365/201; 365/189.04; 365/189.07; 365/191

(58) Field of Search ............................ 365/201, 189.04, 365/189.07, 191, 221; 714/719, 733

(56) References Cited

U.S. PATENT DOCUMENTS 6,651,202 B1 * 11/2003 Phan .......................... 714/733
6,658,611 B1 * 12/2003 Jun ............................. 714/719

\* cited by examiner

*Primary Examiner*—Michael S. Lebentritt
*Assistant Examiner*—Pho M. Luu
(74) *Attorney, Agent, or Firm*—Aaron Waxler

(57) ABSTRACT

Testing an integrated circuit IC (2) with an embedded or integrated non-volatile memory (3), in particular an embedded memory, an EPROM or EEPROM, is particularly difficult because mass production and low prices and minimal profit margins require that the testing, which usually requires expensive and large equipment, can be done in a minimum of time. Usually, the testing of an embedded memory (3) is a kind of bottleneck during manufacturing. A test structure and design and an associated test method this test time for an embedded memory. In essence, a few test devices (8,9) integrated into the IC (2), use of the serial port provided on the IC, and an appropriate test design of a built-in self test whereby predetermined regular test patterns are written automatically into the embedded memory and an automated memory readout is compressed on the IC for a serial readout from it, allow a fast test of the embedded memory and thus circumvent the aforementioned bottleneck.

10 Claims, 4 Drawing Sheets

INTEGRATED CIRCUIT WITH SELF-TEST DEVICE FOR AN EMBEDDED NON-VOLATILE MEMORY AND RELATED TEST METHOD

The present invention relates to the structure and design of test devices and test methods in integrated circuits (ICs) having an embedded or otherwise integrated non-volatile memory, in particular a flash memory, an EPROM, EEPROM, OTP or flash EPROM. Such embedding or integration of non-volatile memory is often desired or even required for ICs to be used in mobile phones, personal digital assistants, in GPS applications for automobile or other navigation purposes. A particular difficult topic is the testing of such ICs, since mass production and low prices and minimal profit margins require that the testing, which usually requires expensive and large equipment, can be done in a minimum of time. Great care must be taken that the testing of such embedded memories does not become a bottleneck during manufacturing.

So-called built-in self tests (BISTs) form a known approach. They are widely used for accelerating the testing of embedded memory, especially memory of the SRAM, DRAM, and ROM type. Unfortunately, embedded non-volatile memory like EPROM, EEPROM, OTP or flash EPROM cannot be tested by such a fully automated built-in self test due to the complex test flow. Thus, it is a first and main objective of the present invention to provide a fast test method for such non-volatile memories.

A second objective is to reduce the so-called test overhead, i.e. any devices just for testing the embedded memory on the IC, since the space on the IC occupied by this test overhead may then be employed to place other, more useful parts on the IC, or the IC's size may be reduced.

In the following, starting from a prior art approach, the present invention and the way in which it solves the above-identified problems shall be described on the basis of an embodiment, together with some drawings in which FIG. 1 shows a prior art test approach of a flash memory by multiplexing the memory ports to primary I/Os;

First, a conventional or prior art approach for testing an embedded memory will be shown and described. Such prior art approaches are common practice in the art and well known to persons skilled in this respect.

Figure 1:
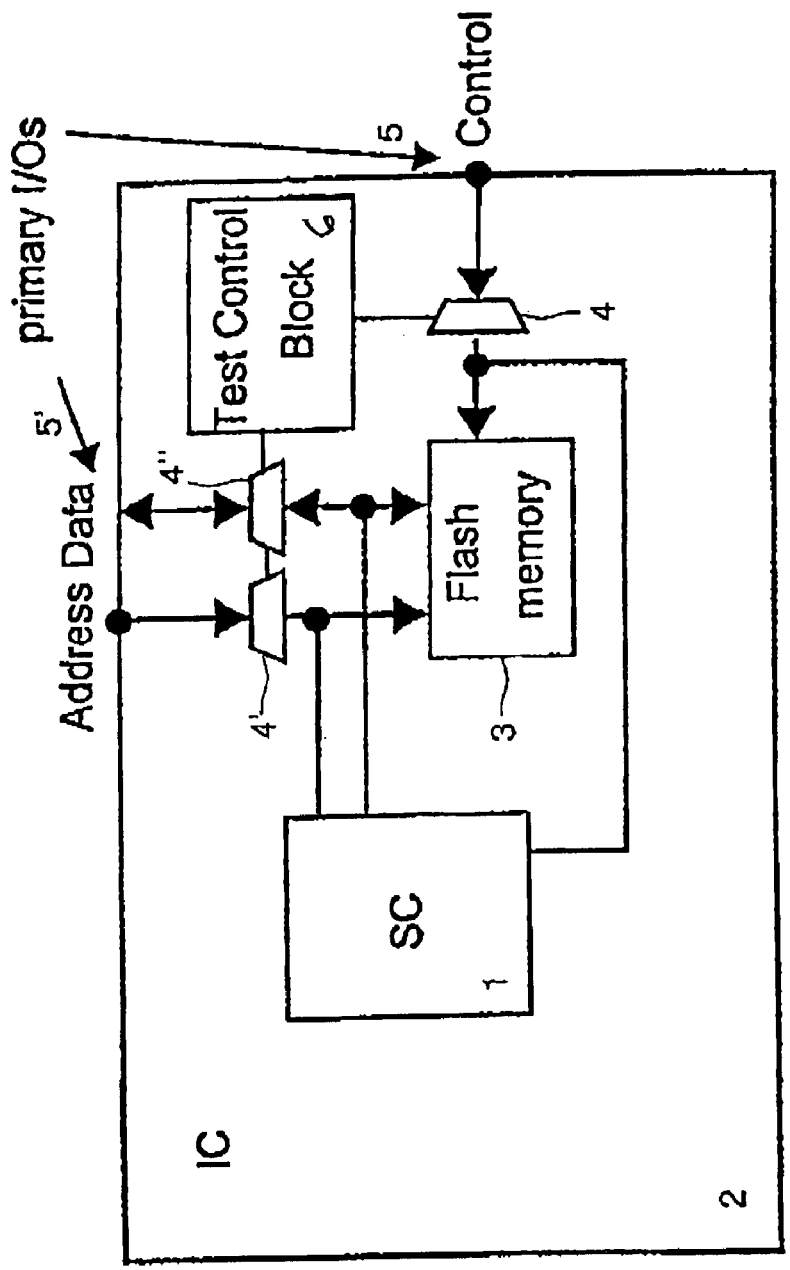

As shown in FIG. 1, in a normal operating mode, the embedded memory 3, connected to the system controller (SC)1, usually serves as code storage for the latter.

In the test mode, as illustrated in FIG. 1, the embedded non-volatile memory 3 is isolated from the rest of the IC chip 2. All inputs and outputs of the memory 3, i.e. data bus, address bus, control lines, are multiplexed by multiplexers 4, 4', 4" to primary I/O pins 5 and 5' of the IC 2. This is controlled by a dedicated test control block 6. Thus, full access to the memory 3 is guaranteed and testing can be performed as if testing a stand-alone memory.

This conventional approach has some drawbacks:

Large circuit overhead is needed for this test mode. All flash signals have to be switched by multiplexers 4, 4', 4" to primary I/Os 5 and 5'. This problem becomes especially severe when the flash has a wide data bus, e.g. if the data bus is 32 bit or 64 bit wide.

It might not be possible to switch all flash ports to primary I/Os 5 and 5', especially in the case of a wide data bus. The reason is that the number of flash ports may exceed the number of primary I/Os.

Another drawback is that this test interface is non-standard. Depending on the number of available I/O pins and the widths of the data and the address bus, a customized test interface must be designed.

The most serious disadvantage of this test method is the slow access protocol, resulting in a rather long test time, as will be outlined in the following.

Figure 2:
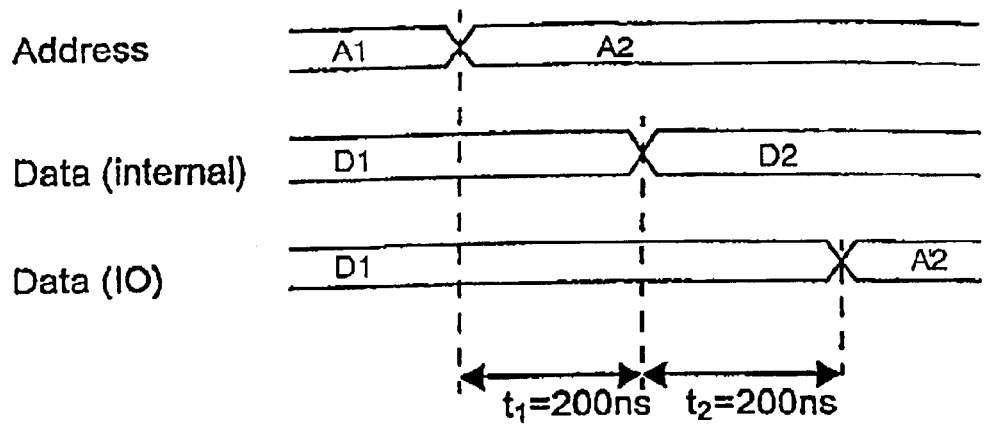
FIG. 2 illustrates a memory read operation with a test approach according to FIG. 1.

FIG. 2 illustrates the read access protocol for this prior art test method. After a new address A2 is applied to the address bus, the read operation on the memory starts. In this example, it is assumed that the read access time $t_1=200$ ns. After this access time $t_1$, the output data is valid, i.e. available on the chip. In a next step, the corresponding output pins of the chip have to be driven. It is assumed that the capacitive load of the tester is 100 pF, that the driving current at the output pins is 1 mA, and that the logic high level is 2V. These assumptions result in an additional delay of $t_2=200$ ns until the output data become available and stable on the I/O pins. One single memory position access therefore needs $t_1+t_2=400$ ns. Thus, taking a memory of 128K words, the total time to read the entire memory is thus $128K*(t_1+t_2)=52$ ms. This is simply unacceptable in most cases.

The new approach according to the invention shortens this time significantly. This new approach will be described hereinafter, together with an embodiment of the invention.

Figure 3:
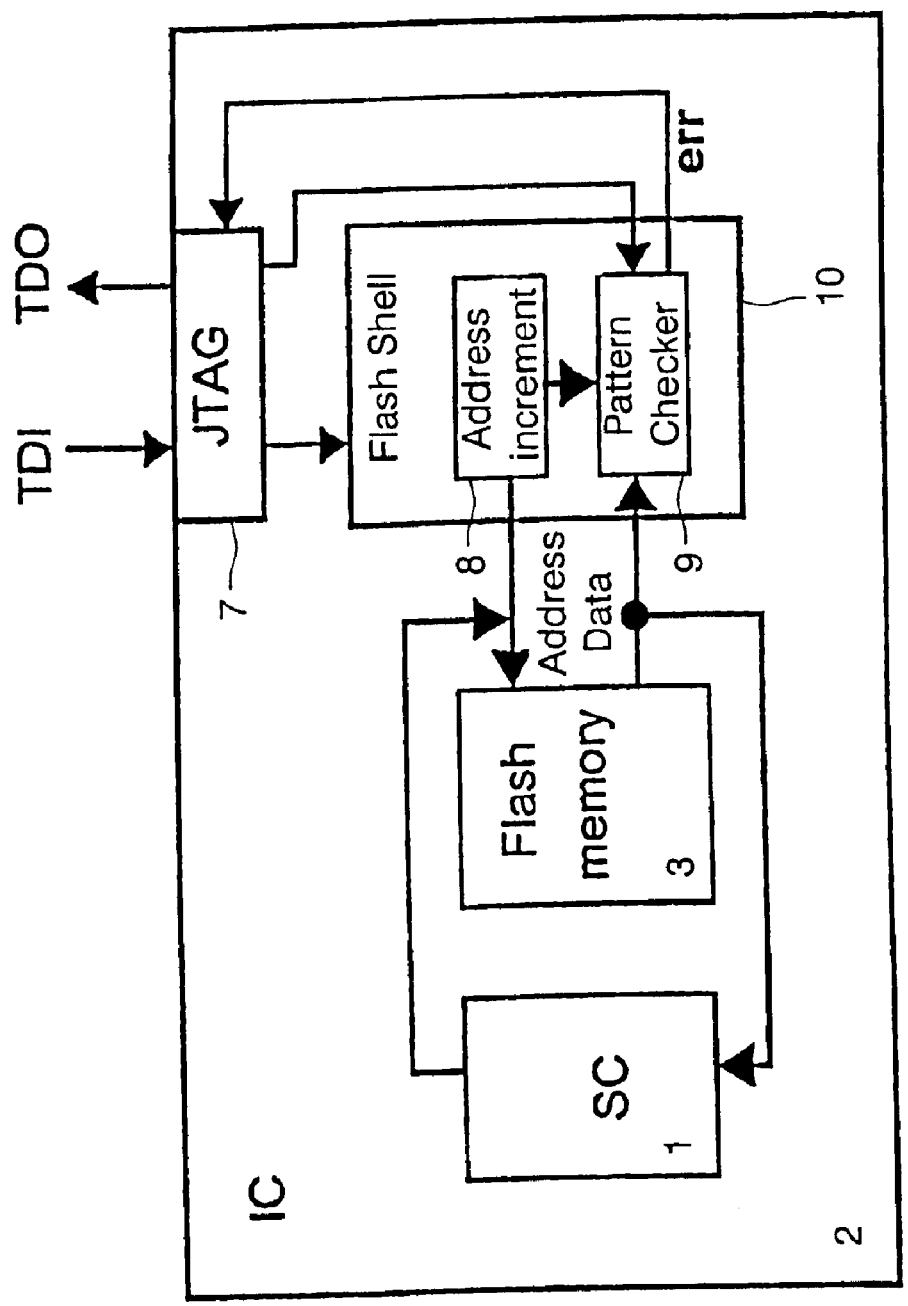
FIG. 3 shows the new test approach according to the invention.

FIG. 3 depicts the block diagram for the new test approach. In contrast to the conventional approach shown in FIG. 1, the embedded memory 3 is no longer accessed with a parallel protocol, but with a serial one. For this, the standard JTAG 7 port serves as serial interface. JTAG stands for Joint Test Action Group as defined in IEEE Standard 1149.1.

The embedded memory 3 is controlled via a building block 10, called "flash shell". This flash shell 10 incorporates an address increment counter 8 which automatically increments the address after every read operation. A read operation is started by serially shifting in the corresponding command on input TDI, standing for Test Data Input of the JTAG 7 as defined in the above-mentioned IEEE Standard.

The output data of the memory is transferred to a block 9 named "pattern checker" which compares the output data of the embedded memory 3 with the expected data. The source of such expected data will be explained in the following.

Figure 4:
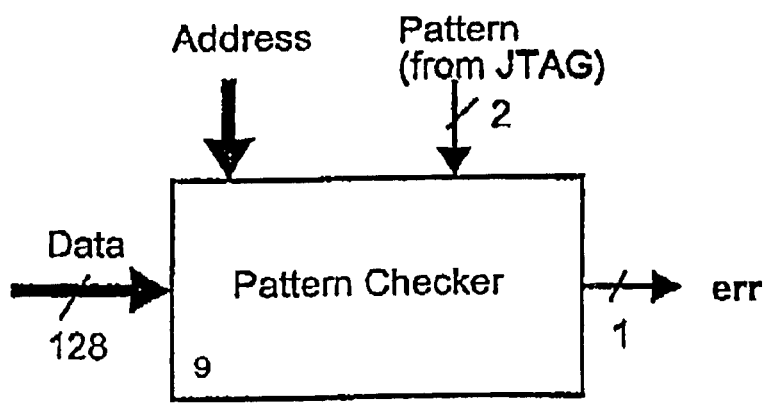
FIG. 4 illustrates a pattern checker to be used with the invention.

FIG. 4 depicts in greater detail the pattern checker 9 which derives the expected response, i.e. the above-mentioned expected data, from the address applied to the embedded memory 3 and the type of pattern which was written into the latter and which consequently should be recognized. As explained below, the type of pattern to be checked can be set on the 2-bit-wide input named "Pattern" in FIG. 4.

Four selectable regular patterns are used for embedded memory testing, they are:

a checkerboard pattern, an inverse checkerboard pattern, an all-bits-programmed pattern, e.g. all "1s", and an all-bits-erased pattern, e.g. all "0s".

The following is a description, by way of example, of a complete test process:

At the start of the test, the memory 3 is fully erased in a first step. This means that all memory positions contain a "1". Then a check cycle is run in which each memory position, the position addresses being automatically advanced by the address increment counter 8, is checked for its content by the pattern checker 9. Depending on a position's content, each position check produces an output signal err at the output of pattern checker 9. The latter is prompted to check for the particular all-bits-programmed pattern via its input "Pattern" from the JTAG 7.

In a second step, a checkerboard pattern is written into memory 3. This is again followed by a check cycle through the pattern checker 9 which has received the appropriate indication from the JTAG 7, namely to check for a checkerboard pattern in the memory.

In a third step, all bits, i.e. memory positions are erased. This time the contents of the memory 3 need not be checked, since this specific check was done in the first step already.

In a fourth step, an inverted checkerbord pattern is programmed into the memory 3, followed by another test cycle through the pattern checker 9, appropriately preset by the JTAG 7.

In a fifth and final step, a checkerbord pattern is again written into the memory 3. Combined with the inverse checkerboard pattern still in the memory, this results in an all-bits-erased pattern, i.e. all "0s" in the memory positions. This is again checked by the pattern checker 9 which is appropriately preset by the JTAG 7.

In other words, any original data word, having a width of 128 bits as indicated in FIG. 4, is collapsed into only one error bit, err in FIG. 4, indicating whether the check of a particular memory position was successful or not. If the output word of the memory 3 matches the expected value preset by the JTAG 7, i.e. the selected pattern of the four above-described patterns written into the memory 3, the output signal of the pattern checker 9 is err=0. Otherwise, i.e. in case of a mismatch, this output signal is err=1. The value of this output signal or error flag is transferred via the JTAG 7 to its output pin TDO, standing for Test Data Output of the JTAG 7 as defined in the above-mentioned IEEE Standard.

This new approach according to the invention has the following advantages:

There is only little additional circuit overhead necessary for the embedded memory testing, i.e. just the address increment counter 8 and the pattern checker 9.

The JTAG port is a standard test interface and fit for re-use.

The embedded memory can be read at maximum possible speed, which drastically reduces the test time. The faster protocol is essentially achieved by two factors, namely by the data compression (in the pattern checker 9) and by a kind of pipelining of the error bits as will be explained in the following with reference to FIG. 5.

Figure 5:
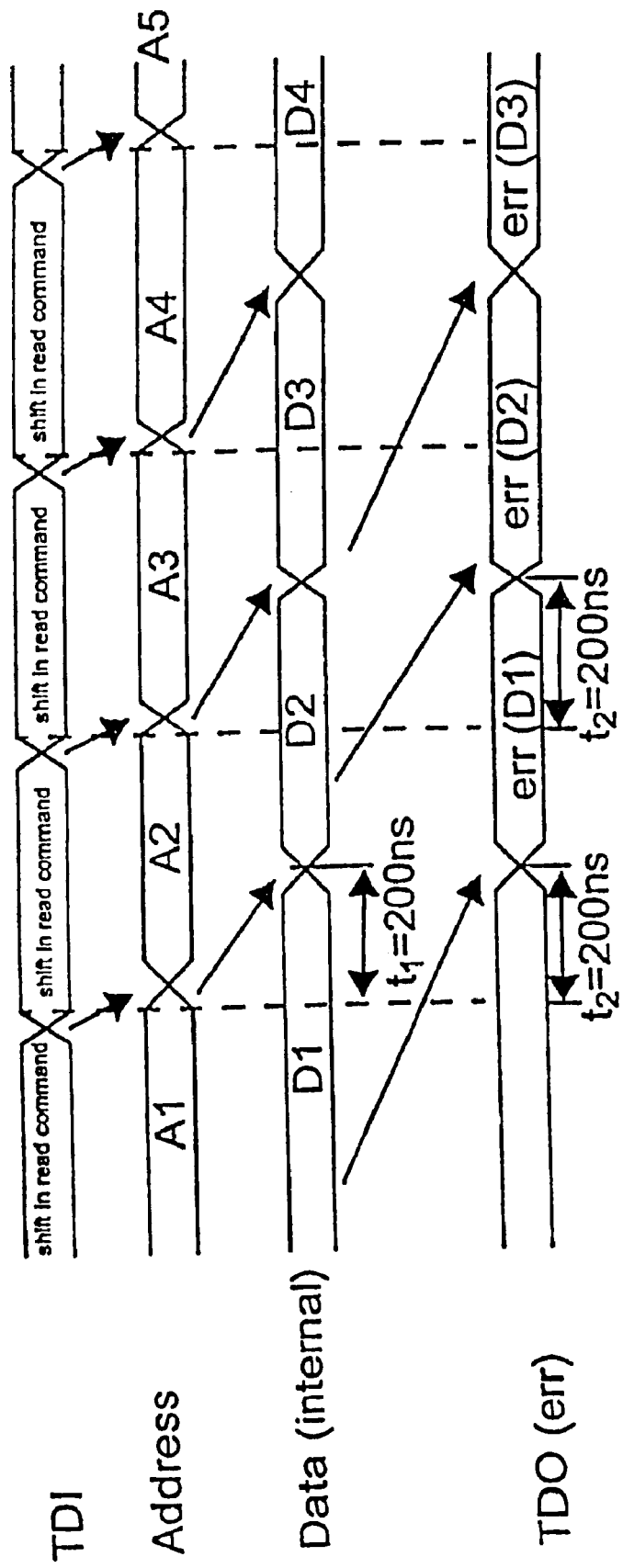
FIG. 5 illustrates a memory read operation with a test approach according to the invention.

FIG. 5 shows the procedure for reading the embedded memory 3 once a test pattern (one of the four) has been written into it. A read command is shifted in via port TDI of the JTAG 7. Triggered by this read command, the address increment counter 8 in flash shell 10 automatically increments the address in embedded memory 3 and a read operation starts. After a time $t_1$, which is the memory access time as explained above, the data read from the memory 3 is available internally on the chip, i.e. the complete data set of the whole memory. The pattern checker 9 compresses this data word of 128 bits into a single error bit (or error flag) on its exit, either err=0, if no error is present, or err=1, to indicate an error.

The value of the error flag is transferred via the JTAG 7 to output port TDO by way of a pipeline. This means that the error flag of a data word n is output during the next read cycle, i.e. the reading of data word n+1. In other words, the output ports containing the error bits of word n are driven completely in parallel to the read access to word n+1 of the embedded memory 3. To allow this parallel readout, the error bits of word n are latched or otherwise kept in an intermediate storage. The result is a kind of pipelining of the error bits, which is one of the decisive factors for the advantage of the present invention over the prior art.

Consequently, the read frequency can be as high as the memory access time $t_1$ or the time $t_2$ to charge the output pins, it is being understood that these values need not necessarily be equal, but are just typical values chosen for the present example. In the latter case, the time needed for reading one data word is $t_1$=200 ns. Reading an entire memory content of 128K thus results in a test time of 128K*$t_1$=26.2 ms. This is about half of the test time compared to the conventional approach which, as shown above, needed 52 ms for the test.

Usually $t_2$, i.e. the time to charge the output pins of the IC, limits the read operation. As explained above, the error flag can be latched, i.e. held for a short time in an intermediate storage to overcome this limitation. This avoids missing any failure, although the failure is no longer detected at the matching address location, since the address "runs away" before the failure is detected.

Taking notice of the above description of an example which is largely based on an embodiment for testing an embedded flash memory, it will be no problem for someone skilled in the art to apply the teaching to any IC design with one or more embedded non-volatile memories, e.g. EPROMs, OTPs, Flash-EPROMs, or the like. In particular, a person skilled in the art can easily introduce modifications and variations according to the above principles without departing from the gist of the invention and the scope of the appended claims.

What is claimed is:

1. An integrated circuit with at least one embedded non-volatile memory, and one or more integrated test devices for conducting a built-in self test of said memory, said test devices comprising
    a pattern checker for serially comparing a data set read out from said memory with a predetermined data pattern previously written into said memory, said pattern checker producing a first output signal when said data set read from said memory is identical to said predetermined data pattern and a second output signal when said data set differs from said predetermined data pattern, and
    an increment counter for automatically incrementing addresses in said embedded memory during reading of said data set, wherein
    the pattern checker is equipped to produce an error bit as its output signal, said error bit indicating whether the data set read from the memory (3) is identical to said predetermined data pattern or not, thus providing a compression of the test result(s).

2. An integrated circuit with at least one embedded non-volatile memory, and one or more integrated test devices for conducting a built-in self test of said memory, said test devices comprising
    a pattern checker for serially comparing a data set read out from said memory with a predetermined data pattern previously written into said memory, said pattern checker producing a first output signal when said data set read from said memory is identical to said predetermined data pattern and a second output signal when said data set differs from said predetermined data pattern, and an increment counter for automatically incrementing addresses in said embedded memory during reading of said data set, wherein the test device is equipped to write a selected one of a plurality of predetermined data patterns into the memory (3), each of said predetermined patterns being of a regular structure so as to allow automated writing into and readout from said memory (3).

3. An integrated circuit with at least one embedded non-volatile memory, and one or more integrated test devices for conducting a built-in self test of said memory, said test devices comprising a pattern checker for serially comparing a data set read out from said memory with a predetermined data pattern previously written into said memory, said pattern checker producing a first output signal when said data set read from said memory is identical to said predetermined data pattern and a second output signal when said data set differs from said predetermined data pattern, and an increment counter for automatically incrementing addresses in said embedded memory during reading of said data set, wherein the output signal of the pattern checker is fed to a serial output port of said integrated circuit (2).

4. An integrated circuit with at least one embedded non-volatile memory, and one or more integrated test devices for conducting a built-in self test of said memory, said test devices comprising a pattern checker for serially comparing a data set read out from said memory with a predetermined data pattern previously written into said memory, said pattern checker producing a first output signal when said data set read from said memory is identical to said predetermined data pattern and a second output signal when said data set differs from said predetermined data pattern, and an increment counter for automatically incrementing addresses in said embedded memory during reading of said data set, wherein an intermediate storage is provided for momentarily holding or latching the output signal of the pattern checker before it is fed to an output port of said integrated circuit (2).

5. A built-in self test method for an integrated circuit (2) with at least one embedded non-volatile memory (3), in particular a flash memory, an EPROM or EEPROMS, and one or more integrated test devices, comprising the following steps writing a predetermined pattern of data into said memory (3), reading said data written from said memory (3) by automatically incrementing addresses in said memory, comparing said data read out from said memory (3) with said predetermined pattern, producing a first output signal when the data read out from said memory is identical to said predetermined pattern and a second output signal when said data differs from said predetermined pattern.

6. A built-in self test method as claimed in claim 5, wherein the writing step comprises selecting a predetermined pattern from a plurality of patterns, the latter including a checkerboard pattern, an inverse checkerboard pattern, an all-bits-programmed pattern, e.g. all "1s", and an all-bits-erased pattern, e.g. all "0s".

7. A built-in self test method as claimed in claim 6, comprising filling the memory (3) with a selected pattern, sequentially reading said memory by automatically incrementing its addresses, address-wise comparing the readout from said memory with expected values of said selected pattern written into said memory, and producing, depending on the results of said comparing step, a single output signal for each memory position and each pattern written.

8. A built-in self test method as claimed in claim 5, wherein the output signal produced in the comparing step is an error bit, preferably a single bit, indicating whether an error occurred or not, an error indicating that the data read differs from the predetermined pattern, preferably said single bit being a "0" when no error is present and a "1" when an error is detected.

9. A built-in self test method as claimed in claim 5, wherein the output signal produced in the comparing step is transferred serially to an output (7) of the integrated circuit (2), and is preferably held in an intermediate storage to provide an accelerated readout from the memory (3).

10. A built-in self test method as claimed in claim 9, wherein the accelerated readout from the memory (3) is effected by outputting the error bit of a data word n during the reading of a subsequent data word n+1, thus driving the output ports containing the error bits of word n in parallel to the read access to word is n+1 in the embedded memory (3).

* * * * *